(12) United States Patent
Stewing

(10) Patent No.: US 12,230,432 B2
(45) Date of Patent: Feb. 18, 2025

(54) CIRCUIT CARRIER FOR AN ELECTRONIC CIRCUIT, AND METHOD FOR PRODUCING THE CIRCUIT CARRIER

(71) Applicant: Robert Bosch GmbH, Stuttgart (DE)

(72) Inventor: Felix Stewing, Steinheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 260 days.

(21) Appl. No.: 17/997,016

(22) PCT Filed: May 25, 2021

(86) PCT No.: PCT/EP2021/063896
§ 371 (c)(1),
(2) Date: Oct. 24, 2022

(87) PCT Pub. No.: WO2021/244903
PCT Pub. Date: Dec. 9, 2021

(65) Prior Publication Data
US 2023/0178290 A1    Jun. 8, 2023

(30) Foreign Application Priority Data

Jun. 4, 2020  (DE) ................ 10 2020 206 989.1

(51) Int. Cl.
*H05K 1/18*  (2006.01)
*H01F 27/24*  (2006.01)
(Continued)

(52) U.S. Cl.
CPC ......... *H01F 27/2804* (2013.01); *H01F 27/24* (2013.01); *H01F 41/0206* (2013.01);
(Continued)

(58) Field of Classification Search
CPC .. H01F 27/2804; H01F 27/24; H01F 41/0206; H01F 41/041; H01F 2027/2809;
(Continued)

(56) References Cited

U.S. PATENT DOCUMENTS 5,694,030 A     12/1997  Sato et al.
2017/0276707 A1* 9/2017  Ghislanzoni ............ H01F 27/24
2017/0352476 A1* 12/2017 Inaba .................... H01F 27/324

FOREIGN PATENT DOCUMENTS

CN      210641154 U     5/2020
DE       10139707 A1    2/2003
(Continued)

OTHER PUBLICATIONS

International Search Report for PCT/EP2021/063896, Issued Sep. 1, 2021.

*Primary Examiner* — Binh B Tran
(74) *Attorney, Agent, or Firm* — NORTON ROSE FULBRIGHT US LLP; Gerard A. Messina

(57) ABSTRACT

A circuit carrier, in particular a circuit board, for an electronic circuit. The circuit carrier includes an electric coil and a core, which is designed to form a magnetic field of the coil, and the coil has windings situated in layers on top of one another, the coil being integrated into the circuit carrier, and the core being situated outside a winding window of the coil.

10 Claims, 4 Drawing Sheets

(51) Int. Cl.
  *H01F 27/28*    (2006.01)
  *H01F 41/02*    (2006.01)
  *H01F 41/04*    (2006.01)
  *H05K 3/30*     (2006.01)

(52) U.S. Cl.
  CPC ........... *H01F 41/041* (2013.01); *H05K 1/181* (2013.01); *H05K 3/303* (2013.01); *H01F 2027/2809* (2013.01); *H05K 2201/10151* (2013.01)

(58) Field of Classification Search
  CPC .................. H05K 1/181; H05K 3/303; H05K 2201/10151
  USPC ......................................................... 361/760
  See application file for complete search history.

(56) References Cited

FOREIGN PATENT DOCUMENTS

| EP | 0926689 A2 | 6/1999 |
|----|------------|--------|
| JP | S63299756 A | 12/1988 |
| JP | 2008233525 A | 10/2008 |

\* cited by examiner

CIRCUIT CARRIER FOR AN ELECTRONIC CIRCUIT, AND METHOD FOR PRODUCING THE CIRCUIT CARRIER

FIELD

The present invention relates to a circuit carrier for an electronic circuit having a coil, the coil in particular being used as an inductivity of a high-frequency filter. In addition, the present invention relates to a method for producing a circuit carrier.

BACKGROUND INFORMATION

German Patent Application No. DE 101 39 707 A1 describes a circuit carrier for an electronic circuit including a coil and a core. An especially small size of the circuit carrier can be achieved by integrating the coil windings into the circuit carrier. The coil integrated into the circuit carrier can be used as an inductivity for filter elements or as an electronic restrictor to reduce electromagnetic interference such as in power converters. Because of the small size of the coil and a usually low inductivity, the coil is especially suitable for high-frequency applications.

SUMMARY

A circuit carrier according to the present invention for an electronic circuit including a coil and a core may offers the advantage that a magnetic field within the coil is measurable, and thus the coil current, so that a correct functionality of the electric circuit can be inferred. To this end, the teaching of the present invention in its most generalized form provides for the positioning of a magnetic field sensor within a winding window of the coil.

The present invention has recognized that a magnetic field sensor is able to be positioned within the coil in a space-saving manner if the core does not penetrate the coil in the winding window, which defines the region within the windings of the coil. The magnetic field sensor is able to measure the current through the coil and to provide the circuit carrier with an additional function. As a result, the circuit carrier according to the present invention is not only able to prevent electromagnetic interference as an electronic restrictor but can also identify a short-circuit within the electronic circuit by an overcurrent detection, for example. In addition, the circuit carrier with the magnetic field sensor is able to be integrated into a three-phase sine filter for a phase-current measurement, for example, and may thus be used for an engine control.

Advantageous further refinements of the circuit carrier according to the present invention are disclosed herein.

A multitude of possibilities exist for the specific development of the circuit carrier, some of these preferably provided variants being described in the following text. For example, the core has two plate-type core elements, which are connected to a topside and an underside of the circuit carrier in the region of the winding window, in particular by an integral connection. Plate-type core element are particularly easy to mount in an automated production method.

In a further refinement of the present invention, the plate-type core elements have metallized surfaces and are soldered to the circuit carrier. As an alternative, the core element may be bonded, but a solder process may preferably be used for an automated assembly, in particular.

According to an example embodiment of the present invention, the magnetic field sensor is preferably situated in the center of the winding window and preferably connected to the circuit carrier by a curable material. The curable material may be an epoxy resin which also forms the structure of the circuit carrier.

The magnetic field sensor may preferably be developed as a Hall-effect sensor.

In addition, according to an example embodiment of the present invention, the windings of the coil may be situated as planar, electrically conductive metal tracks in layers between insulation layers and be connected to one another in an electrically conductive manner with the aid of contact regions. More specifically, planar metal tracks are able to be produced photolithographically on a carrier foil in an automated manner and in high batch sizes, and the carrier foil may form the insulation layer at the same time. Copper tracks are preferably provided as electrically conductive metal tracks. In contact regions for the electrical contacting of the metal tracks, the insulation layer is preferably provided with holes, which are preferably introduced with the aid of a laser drilling process.

According to an example embodiment of the present invention, it is furthermore preferred that the magnetic field formed by the coil is homogeneous in the region of the magnetic field sensor, or put another way, that the magnetic field has the same direction and an approximately similar field strength. The intensity of the magnetic field in this homogeneous magnetic field correlates with the coil current, in particular. To reduce scattering effects and avoid influences of external magnetic fields, the core is preferably positioned and developed in such a way that the winding window of the coil is at least partially covered.

Additional components are able to be placed within the circuit carrier or on a topside and/or underside of the circuit carrier. The surface of the circuit carrier additionally includes utilizable space, in particular as a result of the compact integration of the coil and the magnetic field sensor.

As an alternative or in addition, the circuit carrier is integrally connectable to a preferably larger and single-layer additional circuit carrier. The circuit carrier with an integrated coil and magnetic field sensor may then be integrated as what is commonly known as a surface mounted device (SMD), for instance into the electronic circuit of a control device and be connected with further electronic components of similar sizes.

In addition, the present invention relates to a method for producing an afore-described circuit carrier according to the present invention, in which the windings situated in layers on top of one another are integrated into the circuit carrier at the outset, the magnetic field sensor is positioned within the winding in a winding window and a core is then positioned in such a way that the winding window of the coil is covered.

According to an example embodiment of the present invention, in the method, planar, electrically conductive metal tracks are preferably patterned using a photolithography process, and insulation layers, which are also used as a carrier foil for the metal tracks, are cut to size according to the winding window of the coil and then integrated layer by layer in a lamination production method of the circuit carrier. The electrical contacts to the windings integrated into the circuit carrier and to the magnetic field sensor are able to be exposed with the aid of a laser drilling method.

Additional advantages and details of the present invention result from the following description of preferred embodiments of the present invention and on the basis of the figures.

DETAILED DESCRIPTION OF EXAMPLE EMBODIMENTS

Identical elements or elements having the same function have been provided with the same reference numbers in the figures.

Figure 1A:
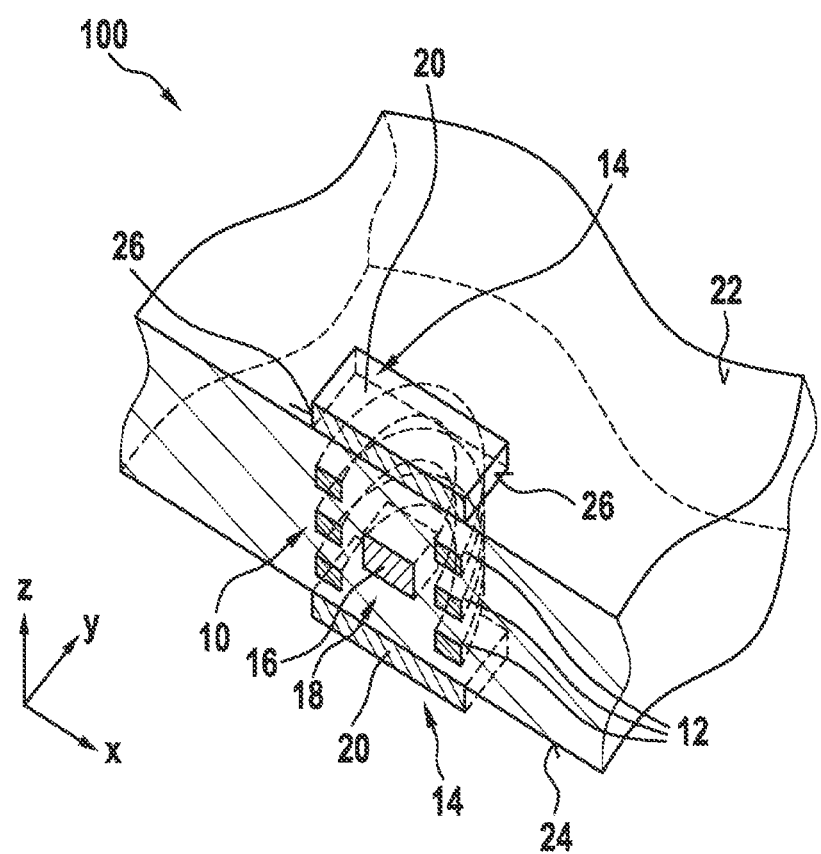
FIG. 1A shows a perspective representation of a cross-section of the circuit carrier including windings disposed in layers on top of one another, a magnetic field sensor within the coil winding, and two plate-type core elements, according to an example embodiment of the present invention.
Figure 1B:
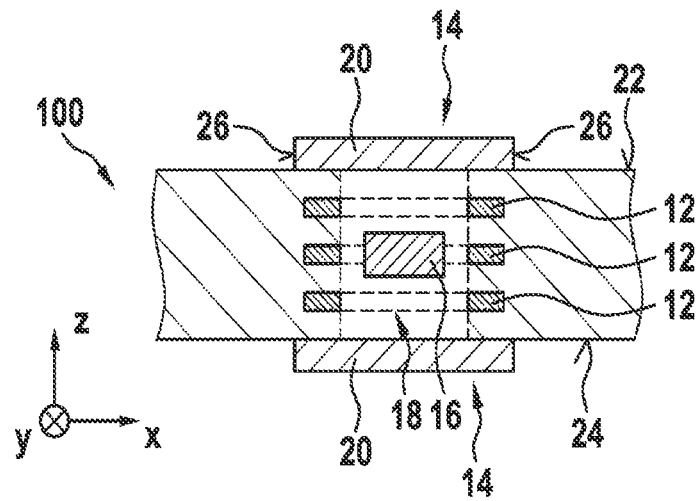
FIG. 1B shows a view of the cross-section of the circuit carrier according to FIG. 1A.
Figure 1C:
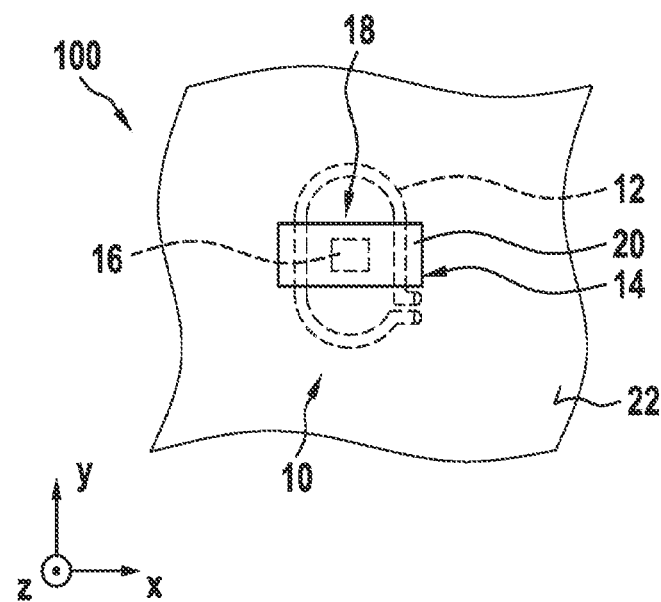
FIG. 1C shows a top view of the circuit carrier according to FIG. 1A.

FIG. 1A through FIG. 1C show a circuit carrier 100 having a coil 10 with layer-type windings 12 and a core 14, and a magnetic field sensor 16 is situated within coil 10 in a winding window 18. Core 14 is situated outside winding window 18 of coil 10. Core 14 is preferably disposed on a topside 22 and an underside 24 of circuit carrier 100. Such a preferred placement does not require any drill holes or recesses in circuit carrier 100 so that the production of circuit carrier 100 and the assembly of core 14 are particularly easy to implement.

Core 14 of coil 10 has two plate-type core elements 20, which are connected to circuit carrier 100 in the region of winding window 18, in particular with the aid of an integral joint. Core elements 20 are preferably dimensioned and disposed in such a way that winding window 18 is at least partially covered. In this way, core elements 20 are able to shield a magnetic field 36 (FIG. 3) within coil 10 from external magnetic fields, and scattering effects can be avoided. In addition, core elements 20 are dimensioned so that a magnetic flux is ensured outside winding window 18 and windings 12. Core elements 20 are preferably produced as ferrite cores or from a compressed ferrite/plastic mixture.

For the integral connection, plate-type core elements 20 are provided with metallized surfaces 26, at which plate-type core elements 20 are soldered to circuit carrier 100. The two metallized surfaces 26 are preferably implemented on at least two oppositely situated sides of plate-type core elements 20. As an alternative, core elements 20 may also be bonded to circuit carrier 100.

Magnetic field sensor 16, e.g., a Hall-effect sensor, is preferably situated in the center of winding window 18 because a particularly homogeneous magnetic field can be assumed there (FIG. 3), and it is connected to circuit carrier 100 by a curable material. The curable material may be an epoxy resin which can also form entire circuit carrier 100. For the electrical contacting, magnetic field sensor 16 is connected to preferably five electrical contacts or circuit traces (not shown) on topside 22 and/or underside 24 of circuit carrier 100.

Figure 2A:
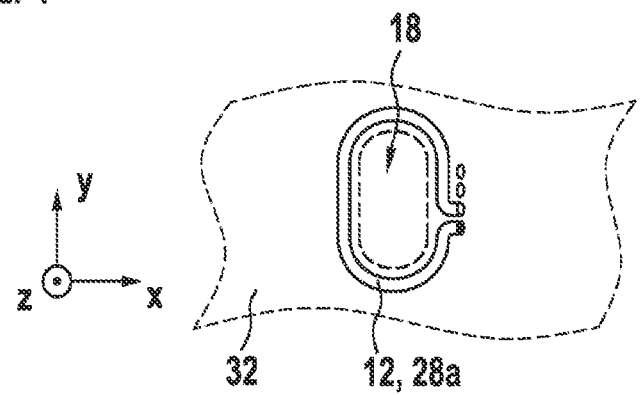
FIG. 2A to FIG. 2C show a top view of the individual windings according to FIG. 1A including electrical contact points.
Figure 2B:
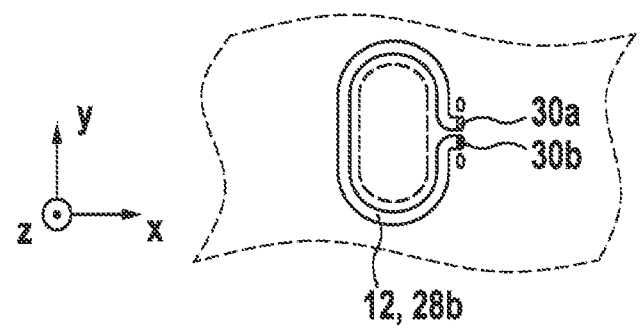
Figure 2C:
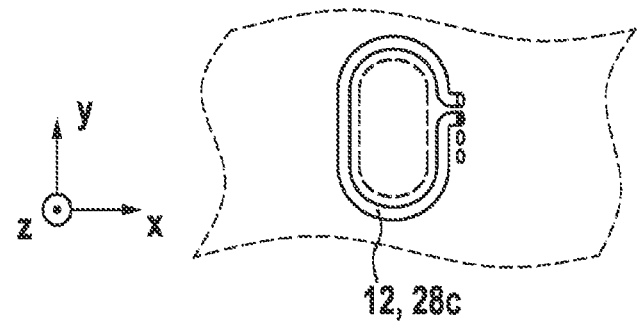

By way of example, FIG. 2A to FIG. 2C show a detailed view of three windings 12 as planar, electrically conductive metal tracks 28a, 28b, 28c. Metal tracks 28a, 28b, 28c are mounted on an insulation layer 32 in each case, which has a bore at contact point 30a for the electrical connection to contact point 30b of the respective next metal track 28a, 28b, 28c. In addition, insulation layer 32 is cut to size in such a way that winding window 18 is exposed for the placement of magnetic field sensor 16.

For the electrical contacting, winding 12 is connected to preferably two electrical contacts or circuit traces (not shown here) on topside 22 and/or underside 24 of circuit carrier 100.

Metal tracks 28a, 28b, 28c, for example, may be produced from copper and patterned using a photolithographic process. The bores at contact points 30a can be provided with the aid of a laser drilling process.

Figure 3:
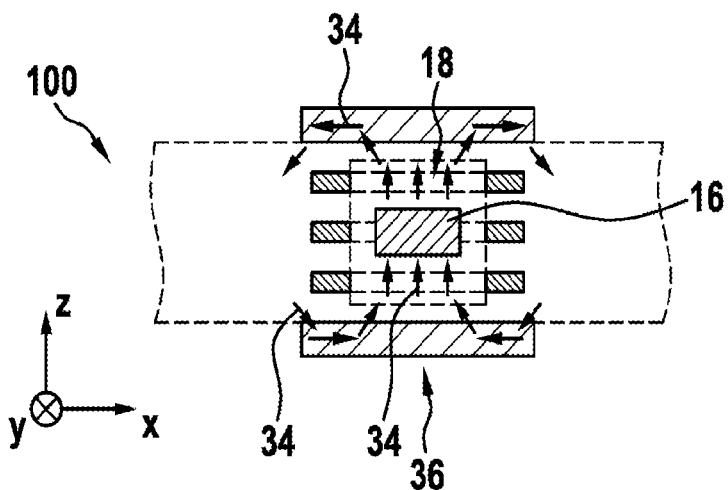
FIG. 3 shows a view of the cross-section of the circuit carrier according to FIG. 1B with arrows to mark the direction and the field strength of a magnetic field.
Figure 4:
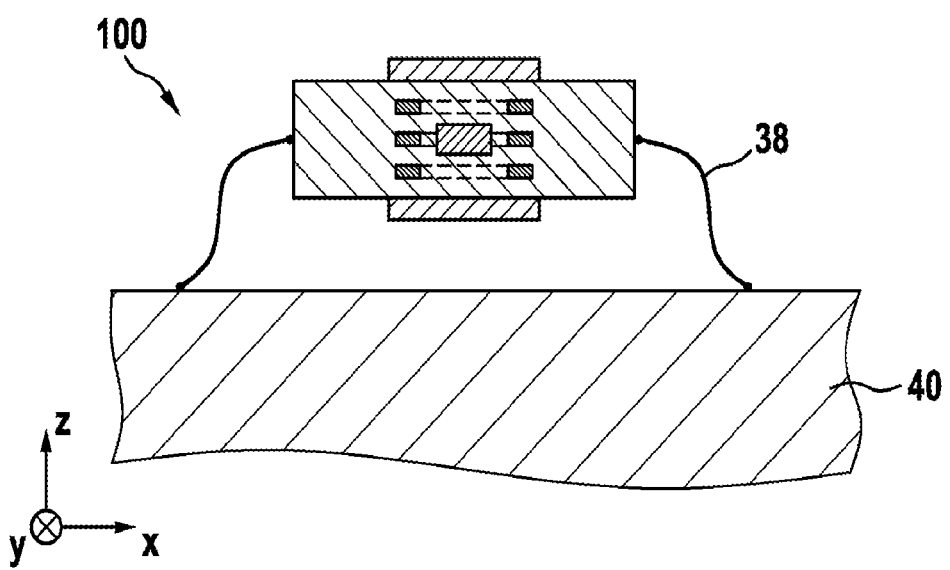
FIG. 4 shows a view of the circuit carrier according to FIG. 1B, which is connected to a larger additional circuit carrier.

FIG. 3 shows the direction and the field strength of magnetic field 36 in the region of coil 10 by arrows 34 by way of example. A homogeneous magnetic field 36 having the same direction and an approximately equal field strength may be developed within winding window 18, in particular. Magnetic field 36 outside winding window 18 shows partially changing amounts and directions. To ensure that measured magnetic field correlates with the coil current, magnetic field sensor 16 is preferably situated within winding window 18 in the region of homogeneous magnetic field 36.

In addition to plate-type core elements 20, further electronic elements may be mounted on topside 22 and/or underside 24 of circuit carrier 100. Moreover, additional components such as capacitive components are able to be integrated within circuit carrier 100.

As an alternative or in addition, entire circuit carrier 100 can be considered an electrical component, which is mounted, preferably with the aid of solder joints 38, as a surface mounted device (SMD) on a preferably single-layer additional circuit carrier 40. Single-layer additional circuit carrier 40 or an additional circuit carrier 40 having few layers, or an additional circuit carrier 40 without integrated components can be produced in a cost-effective manner in comparison with multi-layer circuit carrier 100. For that reason, it may be advisable for larger electric circuits, e.g., for control devices, to connect entire circuit carrier 100 itself as an electrical component to the larger additional circuit carrier 40. Circuit carrier 100 has a preferred width of 15 mm to 25 mm and a preferred length of 25 mm to 35 mm.

Afore-described circuit carrier 100 may be changed or modified in a wide variety of ways without deviating from the present invention. For example, it is possible that windings 12 are formed by a helical wire. In addition, it is also possible to integrate capacitive elements in the region of coil 10.

What is claimed is:

1. A circuit carrier for an electronic circuit, the circuit carrier comprising:
   an electric coil and a core configured to form a magnetic field of the coil, the coil having windings situated in layers on top of one another, the coil being integrated into the circuit carrier, and the core being situated outside a winding window of the coil, wherein a magnetic field sensor is situated within the winding window of the coil.

2. The circuit carrier as recited in claim 1, wherein the core includes two plate-type core elements, which are connected to a topside and an underside of the circuit carrier in a region of the winding window, using an integral connection.

3. The circuit carrier as recited in claim 2, wherein the plate-type core elements have metallized surfaces, which are soldered to the circuit carrier.

4. The circuit carrier as recited in claim 1, wherein the magnetic field sensor is situated in a center of the winding window and is connected to the circuit carrier by a curable material.

5. The circuit carrier as recited in claim 1, wherein the magnetic field sensor is a Hall-effect sensor.

6. The circuit carrier as recited in claim 1, wherein the windings of the coil are situated as planar, electrically conductive metal tracks in layers between insulation layers and are connected to one another in an electrically conductive manner using contact regions.

7. The circuit carrier as recited in claim 1, wherein the magnetic field formed by the coil is a homogeneous magnetic field in a region of the magnetic field sensor.

8. The circuit carrier as recited in claim 1, wherein additional electronic elements are disposed: (i) within the circuit carrier, or (ii) on a topside and/or an underside of the circuit carrier.

9. The circuit carrier as recited in claim 1, wherein the circuit carrier is configured to be connected to a single-layer, additional circuit carrier.

10. A method for producing a circuit carrier, the method comprising the following steps:
- integrating a coil having windings situated in layers on top of one another into the circuit carrier;
- positioning a magnetic field sensor within a winding window of the coil; and
- positioning a core so that the winding window of the coil is at least partially covered.

* * * * *